(12) United States Patent
Cheng et al.

(10) Patent No.: US 9,230,867 B2
(45) Date of Patent: Jan. 5, 2016

(54) STRUCTURE AND METHOD FOR E-BEAM IN-CHIP OVERLAY MARK

(71) Applicant: Taiwan Semiconductor Manufacturing Company, Ltd., Hsin-Chu (TW)

(72) Inventors: Dong-Hsu Cheng, Tainan (TW);
Ming-Ho Tsai, Hsinchu (TW);
Chih-Chung Huang, Hsinchu (TW);
Yung-Hsiang Chen, New Taipei (TW);
Jyun-Hong Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/286,433

(22) Filed: May 23, 2014

(65) Prior Publication Data

US 2014/0256067 A1    Sep. 11, 2014

Related U.S. Application Data

(62) Division of application No. 13/314,644, filed on Dec. 8, 2011, now Pat. No. 8,736,084.

(51) Int. Cl.
*H01L 21/00* (2006.01)
*H01L 21/66* (2006.01)
*G03F 7/20* (2006.01)

(52) U.S. Cl.
CPC ............ *H01L 22/12* (2013.01); *G03F 7/70633* (2013.01)

(58) Field of Classification Search
CPC .................. H01L 23/544; H01L 2223/54453; H01L 2223/54426; H01L 2223/5442
USPC ............................ 257/797; 438/401, 462, 975
See application file for complete search history.

(56) References Cited

U.S. PATENT DOCUMENTS

| | | | |
|---|---|---|---|
| 6,819,426 B2 * | 11/2004 | Sezginer et al. .............. 356/401 |
| 8,278,770 B2 | 10/2012 | Yang | |
| 2013/0147066 A1 | 6/2013 | Cheng et al. | |

* cited by examiner

*Primary Examiner* — Hoa B Trinh
(74) *Attorney, Agent, or Firm* — Haynes and Boone, LLP

(57) ABSTRACT

The present disclosure provides an integrated circuit structure that includes a semiconductor substrate having a first region and a second region having an area less than about 10 micron× 10 micron; a first material layer over the semiconductor substrate and patterned to have a first circuit feature in the first region and a first mark in the second region; and a second material layer over the first material layer and patterned to have a second circuit feature in the first region and a second mark in the second region. The first mark includes first mark features oriented in a first direction, and second mark features oriented in a second direction perpendicular to the first direction. The second mark includes third mark features oriented in the first direction, and fourth mark features oriented in the second direction.

20 Claims, 16 Drawing Sheets

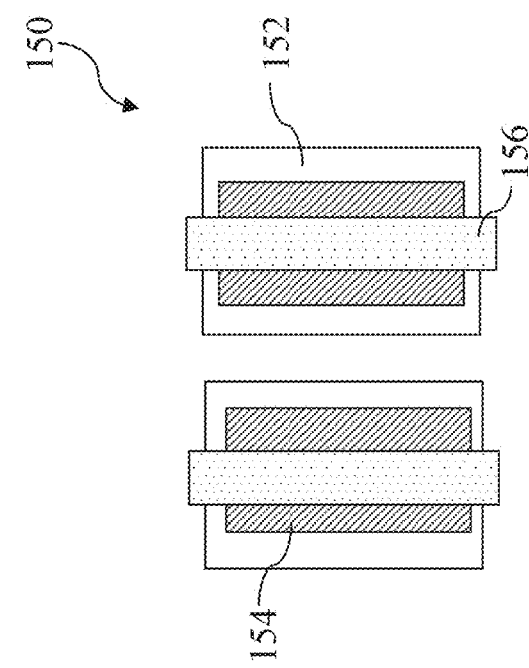
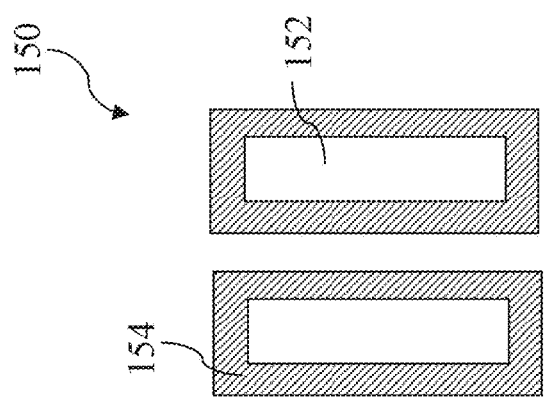
Fig. 7A
Fig. 7B

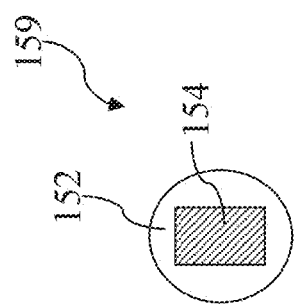
Fig. 7G
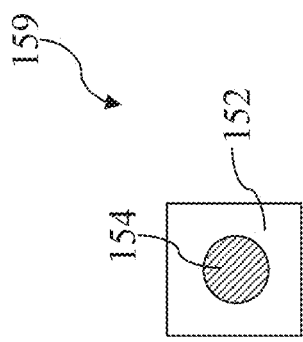
Fig. 7F
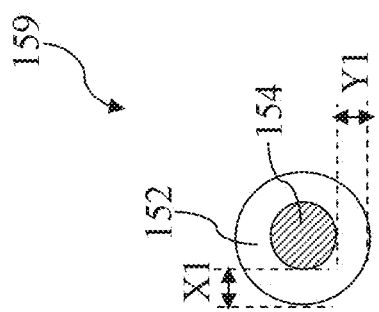
Fig. 7E

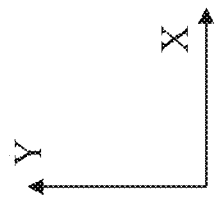
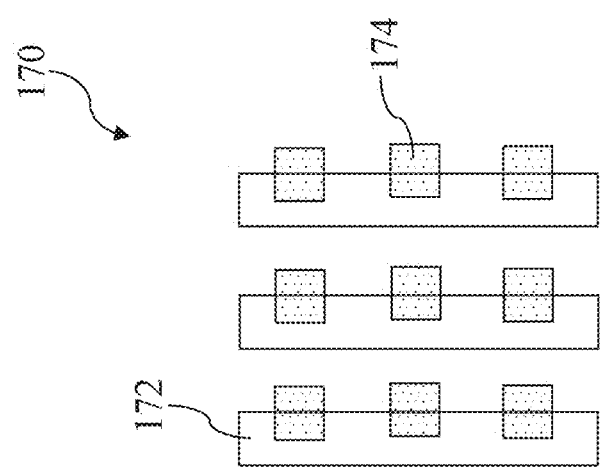
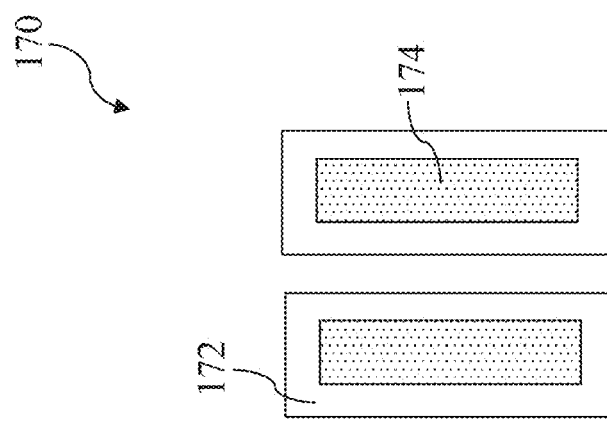
Fig. 9B
Fig. 9A

STRUCTURE AND METHOD FOR E-BEAM IN-CHIP OVERLAY MARK

PRIORITY DATA

This application is a divisional application of U.S. application Ser. No. 13/314,644, filed Dec. 8, 2011, which is hereby incorporated by reference in its entirety.

BACKGROUND

Semiconductor integrated circuit (IC) fabrication involves forming multiple material layers with designed patterns on a semiconductor wafer. Each layer has to be aligned with previous layers such that the formed circuit can function properly. Various marks are used for this purpose. For example, alignment marks are used for alignment between a photomask and the semiconductor wafer. In another example, overlay marks are used to monitor overlay deviation between the layers on the wafer. As semiconductor technology continues progressing to circuit layouts having smaller feature sizes, the alignment requirement becomes more stringent and the alignment/overlay marks are expected to take less wafer area. However, the current overlay marks take a large chip area and cannot be shrunk much due to the resolution of the optical tool used to monitor the overlay marks. In this situation, more chip areas are needed for the overlay marks, resulting in higher manufacturing cost and chip cost. Furthermore, if additional overlay marks are needed in the circuit areas, it is more challenging due to overlay mark size and the place/route concern. It is desired, therefore, to provide an overlay measurement method and a structure for monitoring and controlling in-chip overlay with less silicon area.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIGS. 7A through 7J are fragmental top views of an electron-based mark structure configured according to aspects of the present disclosure in various embodiments.

FIGS. 9A and 9B are fragmental top views of an electron-based mark structure configured according to aspects of the present disclosure in various embodiments.

DETAILED DESCRIPTION

Figure 1:
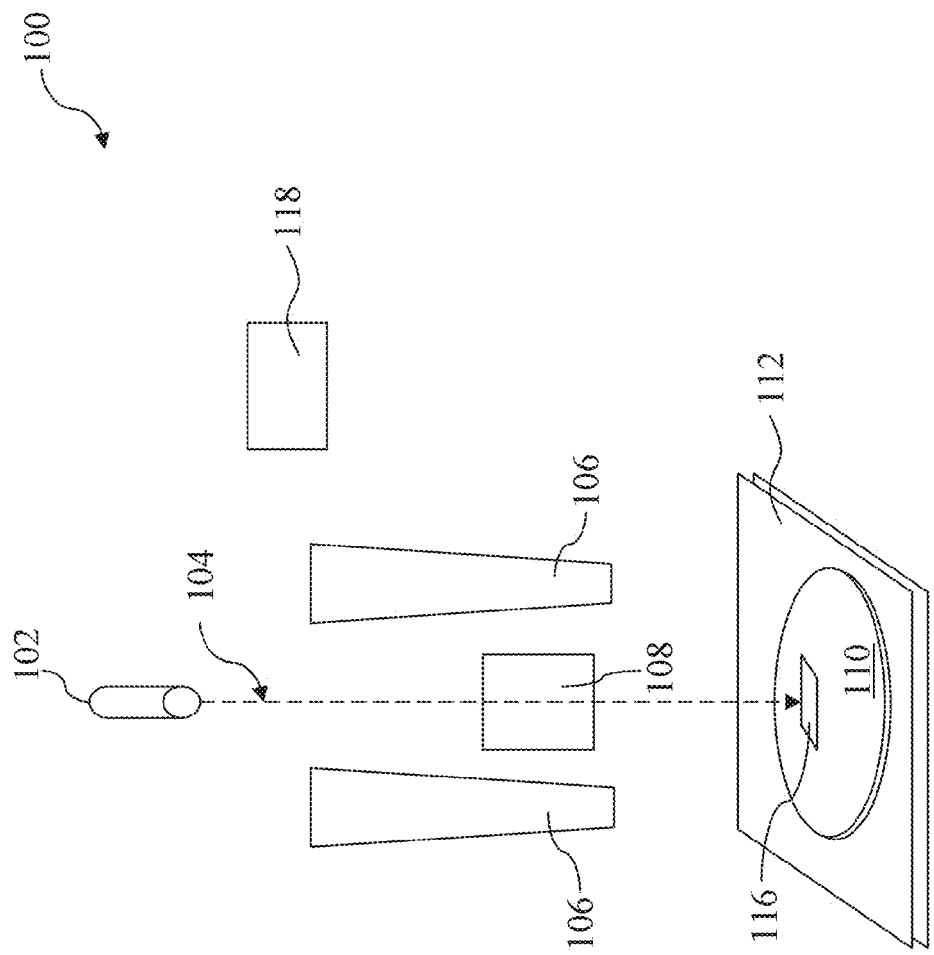
FIG. 1 is a schematic view of one embodiment of an electron-based system for monitoring overlay marks and critical dimension (CD) marks constructed according to aspects of the present disclosure.

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 illustrates a schematic view of an electron-based system 100 for monitoring overlay marks or critical dimension (CD) marks constructed according to aspects of one embodiment of the present disclosure. With reference to FIG. 1, the system 100 and the method to use the same to check the electron-based mark are collectively described.

The electron-based system 100 is an electron-based metrology technique that utilizes an electron-based imaging for various monitoring, measurement and/or analysis. In one embodiment, the electron-based system 100 includes an electron microscope, such as scanning electron microscope. The electron-based system 100 provides a higher imaging resolution than that of an optical microscope because an electron beam can be energized to have a shorter wavelength. However, the electron microscope is used for measurement of critical dimension (CD) but not used in the overlay measurement and analysis. In order to enable the electron-based system 100 for monitoring, measuring and analyzing overlay marks, the corresponding overlay marks need to designed and configured properly and further incorporating into the present circuit structure and the integrated circuit fabrication flow for effectiveness and efficiency. The present disclosure provides electron-based overlay marks, the method making the same and the method utilizing the same by the electron-based system in various embodiments.

The electron-based system 100 includes a particle source 102 to provide a particle beam. In the present embodiment, the particle source is an electron source and the particle beam is an electron beam. In furtherance of the embodiment, the source 102 is an electron gun with a mechanism to generate electrons, such as by thermal electron emission. In a particular example, the electron gun includes a tungsten (or other suitable material) filament designed and biased to thermally emit electrons. In FIG. 1, an electron beam 104 is illustrated as an incident electron beam from the source and directed toward the sample to be detected.

The electron-based system 100 includes one or more lenses 106 to impact the electron incident beam 104 from the source 102 for imaging effect. In one embodiment, the lenses 106 includes a condenser lens to focus the electron beam 104 into smaller diameter, and further includes an objective lens properly configured. Various lenses, such as magnets, are designed to provide force to the electrons for proper imaging effect, such as focusing.

The electron-based system 100 also includes a scanner 108 to deflect the electron beam 104 for scanning a certain region of the sample in a certain mode, such as raster mode. In the present embodiment, the sample to be detected is a wafer 110 for integrated circuits. The scanner 108 is operable to direct the electron beam 104 to the wafer 110 positioned on a wafer stage 112. In one example, the scanner 108 may include one or more coils to deflect the electron beam 104 in two orthogonal directions such that the electron beam is scanned over a surface area of the wafer 110.

In one embodiment, the wafer stage 112 is operable to move such that the electron beam 104 is directed to various electron-based overlay marks formed on the wafer 110. The wafer 110 includes a plurality of electron-based marks stacked in the same mark region 116 that is disposed in a main circuit area, a frame region and/or a scribe line. In the present embodiment, the electron-based marks are overlay marks for monitoring, measuring and analyzing the overlay between various material layers on the wafer 110.

In one embodiment, the wafer 110 includes a plurality of mark regions 116 located at different locations of the main circuit areas, chip frame regions and scribe line regions. Each of the multiple mark regions includes a plurality of electron-based marks stacked in that region. In the present embodiment, the plurality of electron-based marks stacked in one region are overlay masks for determining (such as monitoring or measuring) the overlay error between two patterned circuit layers formed on the wafer. If the overlay error is greater than an acceptable range, then a rework process may be initiated, such as removing the overlying patterned circuit layer and forming another patterned circuit layer, with consequence that re-optimizes the exposure tool control algorithm for next coming wafer lots.

The system 100 further includes a detector 118 to receive a signal (or an overlay signal) from the wafer 110. The overlay signal is an energy flow from the substrate and generated by the interaction between the incident electron beam 104 and the wafer 110. The overlay signal is from a certain area of the wafer 110, such as the spot of the incident electron beam 104. In one example, the detector 118 is designed operable to move and receive the intended overlay signal from the wafer 110.

In one embodiment, the overlay signal includes reflected electrons that are the reflection of the incident electron beam 104 from the substrate after interaction (such as elastic collision) with the atoms of the wafer 110.

In another embodiment, the overlay signal includes electrons that are secondary electrons generated from the substrate by the inelastic collision between the incident electron beam 104 and the atoms of the wafer 110.

In yet another embodiment, the overlay signal includes an electromagnetic radiation emitted from the substrate after the inelastic collision between the incident electron beam 104 and the atoms of the wafer 110.

In yet another embodiment, the overlay signal includes an electrical current in the wafer. That electrical current is from the incident electron beam absorbed to the wafer and therefore referred to as beam current.

In each embodiment, the detector 118 is designed with a proper mechanism to effectively detect the overlay signal (electrons, electromagnetic radiation or electrical current). The detector 118 is further positioned and configured for proper detection. For example, if the overlay signal is the beam current, the detector 118 may be coupled to the wafer for current detection.

The electron-based system 100 may further include other components and modules. In one example, the electron-based system 100 includes an amplifier designed and configured to amplify the overlay signal to a higher level. In another example, the electron-based system 100 includes a display module to display the scanned image to be visualizable to human eyes. In another example, the electron-based system 100 further includes a module for extraction and analysis based on the detected data and scanned images.

Figure 2:
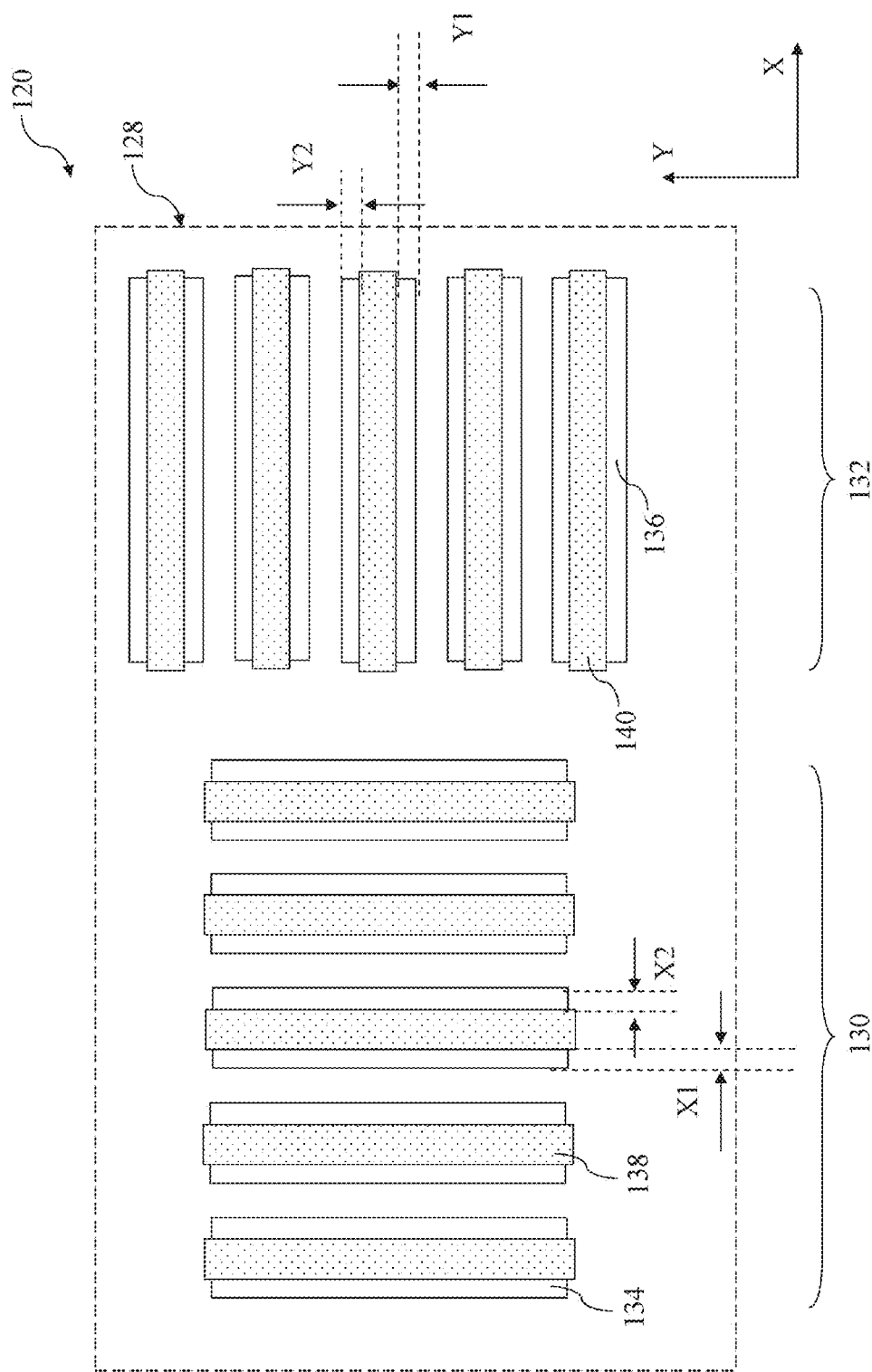
FIG. 2 is a top view of an electron-based mark structure configured according to various aspects of the present disclosure in one or more embodiments.
Figure 3:
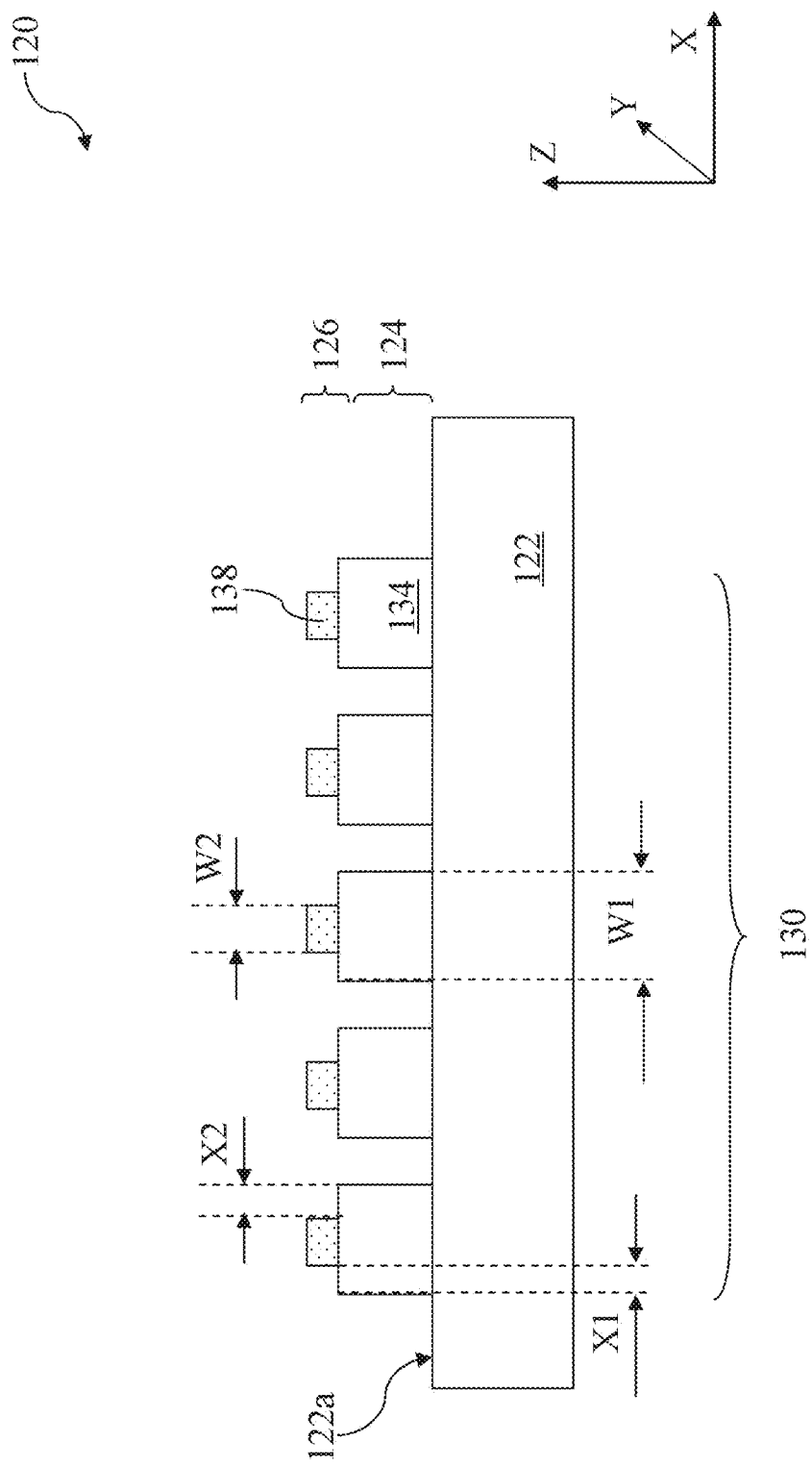
FIG. 3 is a fragmental sectional view of an electron-based mark structure configured according to aspects of the present disclosure in one embodiment.

FIG. 2 is a top view of one embodiment of an electron-based mark structure 120 constructed according to various aspects of the present disclosure. The electron-based mark structure 120 may be used for overlay monitoring, measurement and analysis by the electron-based system 100. FIG. 3 is a fragmental sectional view of an electron-based mark structure 120 in one embodiment. The electron-based mark structure 120, the method making the same and the method to utilize the electron-based mark structure are collectively described with reference to FIGS. 2 and 3.

The electron-based mark structure 120 is formed on an integrated circuit substrate 122, such as a silicon wafer. The substrate 122 may additionally or alternatively include germanium, silicon germanium, gallium arsenic, or other proper semiconductor materials. The substrate 122 may include various doped regions, dielectric features, and/or a portion of multilevel interconnects. In one embodiment, the substrate 122 includes various doped features for various microelectronic components, such as a complementary metal-oxide-semiconductor field-effect transistor (CMOSFET), an imaging sensor, a memory cell, and/or a capacitive element. In another embodiment, the substrate 122 includes conductive material features and dielectric material features configured for coupling and isolating various microelectronic components, respectively. In another embodiment, the substrate 122 include one or more material layers formed thereon. The substrate 122 includes a top surface 122a defined by two orthogonal directions X and Y. A third direction Z is defined in a direction perpendicular to both X and Y directions (or perpendicular to the top surface 122a).

In one embodiment, the electron-based overlay mark structure 120 includes a first overlay mark 124 and a second overlay mark 126 formed in a mark region 128 of the substrate 122. The second overlay mark 126 is stacked on the first overlay mark 124. Since the electron-based mark structure 120 is designed to be detected by the electron-based system 100, the mark region 128 to hold the first and second overlay marks (124 and 126) is small in size such that an optical microscope is not capable of visualizing (detecting with enough resolution) the mark structure 120 for overlay determination. The mark region 128 spans in the first direction X and the second direction Y. In one example, the area of the mark region 128 is less than about 10 micron×10 micron. In another example, the longest dimension of the mark region 128 is less than about 10 micron. In another example, the mark region 128 is a rectangle area having a length less than 10 micron and a width less than 5 micron.

In one embodiment, the first overlay mark 124 is formed in a first material layer and the second overlay mark 126 is formed in a second material layer. In one embodiment, the first material layer or the second material layer includes an overlay mark, an feature for critical dimension (CD) measurement, and a circuit feature. In the present embodiment, the overlay mark structure 120 is formed in an interconnect structure having a metal layer and a via layer. The overlay mark structure 120 is formed with interconnect features (e.g., metal lines, contacts, and vias). The metal layer includes a plurality of metal lines and the via layer includes a plurality of via features configured to vertically connect the metal lines of the metal layer to respective metal lines in an adjacent metal layer.

In one example, the interconnect structure includes aluminum, such as aluminum (Al) or aluminum copper (AlCu) alloy to form various metal lines and via features. In this case, metal lines may be formed by metal deposition and metal etching. The via features may be formed by trench etching and metal filling. In another example, the metal lines and the via features may be formed in a procedure including etching a dielectric layer to form trenches, depositing AlCu alloy to fill in the trenches and on the dielectric layer; and etching the deposited AlCu alloy to form the metal lines.

In another example, the interconnect structure includes contact features (or via features) of tungsten (or other suitable metal) that may be formed by a damascene process. The damascene process includes etching a dielectric layer to form trenches, filling the trenches with tungsten, and performing a polishing process to remove excessive tungsten deposited on the dielectric layer. In yet another example, the interconnect structure includes metal lines and via features of copper that may be formed by a damascene process, such as a single damascene process or a dual damascene process.

In the present example, the first overlay mark 124 is formed in a metal layer and the second overlay mark 126 is formed in a via layer. In an alternative example, the first overlay mark 124 is formed in a via layer and the second overlay mark 126 is formed in a metal layer.

The overlay mark structure 120 is formed with the functional interconnect features (such as metal lines, vias/contacts) such that the overlay mark structure 120 is formed in a same procedure to form respective interconnect features of the interconnect structure. For example, when the mark features are in a via layer, the mark features are formed simultaneously in a same process to form the respective via features in the via layer. In another example, when the mark features are in a metal layer, the mark features are formed simultaneously in a same process to form the respective metal lines in the metal layer.

In one embodiment, each of the first overlay mark 124 and the second overlay mark 126 includes a plurality of mark features respectively oriented in two orthogonal directions and designed for determining the overlay errors in both directions. Particularly, the mark region 128 includes a first sub-region 130 for mark features oriented in the X direction and a second sub-region 132 for mark features oriented in the Y direction. Furthermore, the first overlay mark 124 includes first Y-oriented mark features 134 oriented in the Y direction and first X-oriented mark features 136 oriented in the X direction. Similarly, the second overlay mark 126 includes second Y-oriented mark features 138 oriented in the Y direction and second X-oriented mark features 140 oriented in the X direction. FIG. 3 only shows the mark features (the first Y-oriented mark features 134 and the second Y-oriented mark features 138) located in the first sub-region 130.

The second overlay mark 126 is stacked on the first overlay mark 124 in the mark region 128 such that the mark features of the first overlay mark 124 are at least partially uncovered by the mark features of the second overlay mark 126, in order to have the overlay signal detectable from the first overlay mark 124 for overlay error determination. The second material layer wherein the second overlay mark 126 is formed is not transparent to electrons.

In the present embodiment, the first Y-oriented mark features 134, the first X-oriented mark features 136, the second Y-oriented mark features 138 or the second X-oriented mark features 140 are a plurality of parallel line features configured periodically. In furtherance of the embodiment, the parallel lines have an equal line width and an equal line space between two neighbor lines.

In one example, the second Y-oriented mark features 138 are designed to land on the first Y-oriented mark features 134, respectively. In another example, the first Y-oriented mark features 134 include a first line width W1 and the second Y-oriented mark features 138 include a second line width W2 substantially less than W1 so that the first Y-oriented mark features 134 and the first X-oriented mark features 136 are at least partially exposed (uncovered by the mark features of the second overlay mark 126).

Particularly, the first Y-oriented mark features 134 each include a first exposed portion having a dimension X1 along the X direction and a second exposed portion having a dimension X2 along the X direction, as illustrated in FIGS. 2 and 3. In the designed layout according to the present embodiment, X1 is equal to X2. However, due to overlay error in the fabrication, deviation or shift may be present between the first Y-oriented mark features 134 and the second Y-oriented mark features 138. In this case, X1 is not equal to X2. The overlay error in the X direction can be determined by X1 and X2. In the present embodiment, the overlay error in the X direction (shift in the X direction or X_shift) can be determined by X1 and X2 associated with the first Y-oriented mark features 134 and the second Y-oriented mark features 138 in a formula as X_shift=(X2−X1)/2.

Similarly, the first X-oriented mark features 136 each include a first exposed portion having a dimension Y1 along the Y direction and a second exposed portion having a dimension Y2 along the Y direction, as illustrated in FIG. 2. In the designed layout according to the present embodiment, Y1 is equal to Y2. However, due to overlay error in the fabrication, a deviation or shift may be present between the first X-oriented mark features 136 and the second X-oriented mark features 140. In this case, Y1 is not equal to Y2. The overlay error in the Y direction can be determined by Y1 and Y2. In the present embodiment, the overlay error in the Y direction (shift in the Y direction or Y_shift) can be determined by Y1 and Y2 associated with the first X-oriented mark features 136 and the second X-oriented mark features 140 in a formula as Y_shift=(Y2−Y1)/2.

The overlay mark 124 or the overlay mark 126 is formed on the substrate 122 with the respective circuit features during a process of depositing and patterning the respective (first or second) material layer. In one example, the formation of the first overlay mark 124 or the second overlay mark 126 includes coating a photoresist layer, exposing the photoresist layer, developing the photoresist layer to form a patterned photoresist layer having an opening defined therein; and etching the underlying (the first or second) material layer through the opening of the patterned photoresist layer using the patterned photoresist layer as an etch mask.

After the overlay marks 124 and 126 are formed on the substrate 122, especially, after the etching step to form the second overlay mark 126 in the second material layer, the substrate 122 is transferred to an electron-based metrology system for measuring overlay error and further measuring critical dimension (CD) of the circuit features. In one example, the electron-based metrology system is the electron-based system 100 illustrated in FIG. 1. During the measuring of the overlay error between the first overlay mark 124 and the second overlay mark 126, an electron beam is directed to the overlay mark structure 120, specifically a spot of the overlay mark structure in the mark region 128. Then the electron beam is scanned over the overlay mark structure in the mark region 128. Particularly, the first Y-oriented mark features 134 and the second Y-oriented mark features 138 are scanned along the X direction to form a profile image (or an image) of the mark features 134 and 138 along the X direction. Similarly, the first X-oriented mark features 136 and the second X-oriented mark features 140 are scanned along the Y direction to form a profile image (or an image) of the mark features 136 and 140 along the Y direction. The overlay signal from the overlay mark structure 120 is received by the detector of the electron-based metrology system for overlay determination, such as overlay measurement and analysis. When scanning the Y-oriented mark features, the overlay signal includes a first signal from the first Y-oriented mark features 134 (specifically, the exposed portions) and a second signal from the second Y-oriented mark features 138. When scanning the X-oriented mark features, the overlay signal includes a first signal from the first X-oriented mark features 136 (specially, the exposed portion) and a second signal from the second X-oriented mark features 140. In one embodiment, the overlay signal includes secondary electrons from the wafer surface after the interaction between the incident electrons and atoms of the wafer.

In various embodiments of the disclosed semiconductor structure and corresponding structure of the overlay mark structure, one more following advantages may present in each particular embodiment. In one example, since the electron-based overlay mark structure 120 has a much smaller size relative to an optical-based overlay mark, the wafer area is saved for more integrated circuit and/or more number of the electron-based overlay marks.

In another example, both overlay and CD are measured by in the electron-based metrology system, such as the electron-based system 100. This will save the metrology cost since the CD measurement and the overlay measurement are implemented in a same procedure including transferring the wafer to the electron-based system, measuring CD, measuring overlay, and thereafter transferring the wafer out of the electron-based metrology system.

In yet another example, since the electron-based overlay mark is formed with the circuit features on the wafer after etching, the measured overlay error is more accurate than that in the optical-based overlay mark. In contrast, the optical-based overlay mark is formed on the photoresist layer after developing the photoresist, thus measured overlay error reflects the overlay error between the patterned photoresist layer and the first material. After the etch process to transfer the patterns from the patterned photoresist layer to the second material layer that is overlying on the first material layer, the overlay error may be changed and be different from the measured overlay error after various deviation introduced during the etching process.

In yet another example, the electron-based mark structure 120 is designed such that the electron-based metrology system is able to measure the overlay error with reduced or eliminated charging issue because the first overlay mark 124 and the second overlay mark 126 are conductive. If the overlay mark is formed in the patterned photoresist layer and is measured at that stage, the charging issue may degrade the measurement quality.

In yet another example, the electron-based mark structure 120 includes the first Y-oriented mark features 134, the first X-oriented mark features 136, the second Y-oriented mark features 138, the second X-oriented mark features 140. Each group of mark features includes a plurality of parallel lines oriented in a same direction. Thus, the overlay error may be determined using a statistical average based on the data from the plurality of mark features in the same group with higher accuracy. Especially, since multiple mark features are present in each group, the etching loading effect or imaging loading effect associated with pattern density can be reduced after averaging or taking only a subset of the mark features in the same group. Alternatively or additionally, if any one mark feature is damaged or has a defect, the data from the damaged mark feature may be excluded.

Figure 4:
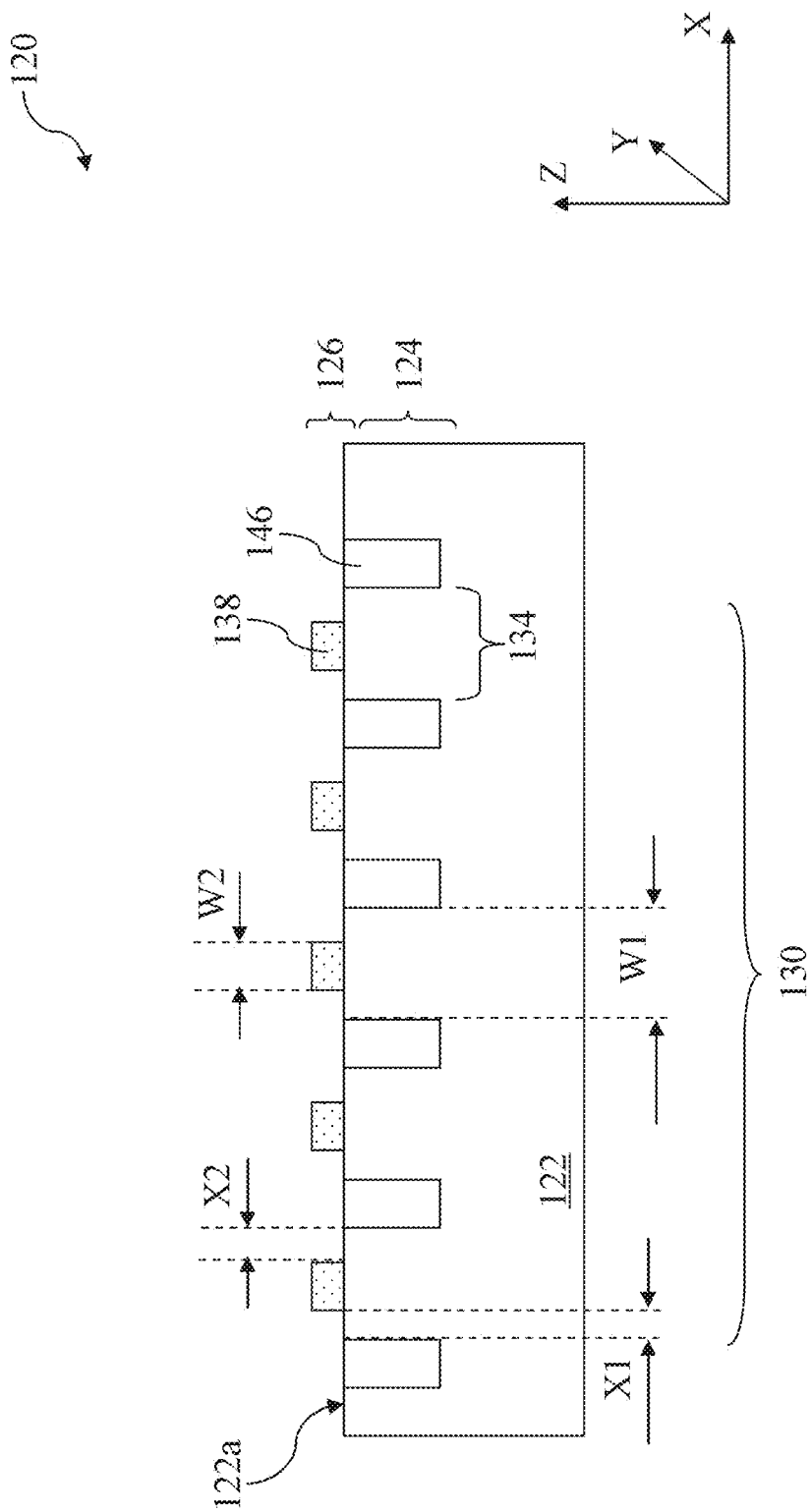
FIGS. 4 and 5 are fragmental sectional views of an electron-based overlay mark structure configured according to aspects of the present disclosure in other embodiments.

Although the overlay mark structure 120 is formed in the interconnect structure, it is not limited to and may be extended to other material layers for overlay determination. FIG. 4 is a fragmental sectional view of the electron-based mark structure 120 constructed according to various aspects in another embodiment. With reference to FIGS. 2 and 4, the overlay mark structure 120 is described below according to this embodiment.

The electron-based marks 120 are formed on an integrated circuit substrate 122. The substrate 122 includes a top surface 122a defined by two orthogonal directions X and Y. A third direction Z is defined in a direction perpendicular to both X and Y directions.

In one embodiment, the electron-based overlay mark structure 120 include a first overlay mark 124 and a second overlay mark 126 formed in a first region 128 of the substrate 122. The second overlay mark 126 is stacked on the first overlay mark 124. Since the electron-based mark structure 120 is designed to be detected by the electron-based system 100, the mark region 128 to hold the first and second overlay marks (124 and 126) are small in size such that an optical microscope is not capable of visualizing the mark structure 120 for overlay determination.

The overlay mark structure 120 in FIG. 4 is similar to the overlay mark structure 120 in FIG. 3. However, the first overlay mark 124 is formed in the substrate 122 and the second overlay mark 126 is formed in a material layer on the substrate. In the present embodiment, the first overlay mark 124 is formed in the substrate and the second overlay mark 126 is formed in the conductive layer for gate electrodes (or a gate layer). Stated differently, the first overlay mark 124 is formed in a semiconductor material layer and the second overlay mark 126 is formed in the conductive layer for gate electrodes.

Various dielectric isolation features 146, such as STI features, are formed in the substrate 122. The dielectric isolation features 146 define various semiconductor regions that are referred to as active regions. Various circuit features and devices are formed in the active regions. For field effect transistors, gate electrodes are formed on the active regions and interposed by gate dielectric material features. The gate electrodes and gate dielectric features are collectively referred to as gate stacks.

In the present embodiment, the first overlay mark 124 is formed and defined by the active regions of the substrate 122. The second overlay mark 126 is formed and defined by the gate stacks on the active regions.

In one embodiment, each of the first overlay mark 124 and the second overlay mark 126 includes a plurality of mark features respectively oriented in two orthogonal directions and designed for determining the overlay errors in both directions. Particularly, the first region 128 includes a first sub-region 130 for mark features oriented in the X direction and a second sub-region 132 for mark features oriented in the Y direction. Furthermore, the first overlay mark 124 includes a first Y-oriented mark features 134 oriented in the Y direction and a first X-oriented mark features 136 oriented in the X direction. Similarly, the second overlay mark 126 includes a second Y-oriented mark features 138 oriented in the Y direction and a second X-oriented mark features 140 oriented in the X direction.

FIG. 4 only shows the mark features (the first Y-oriented mark features 134 and the second Y-oriented mark features 138) located in the first sub-region 130. Referring to FIG. 4, the first Y-oriented mark features 134 are a plurality active regions and the second Y-oriented mark features 138 are a plurality of gate electrodes (or gate stacks).

The gate dielectric features include a dielectric material, such as silicon oxide, a high k dielectric material, or other suitable dielectric material. The gate electrodes include a conductive material, aluminum, copper, tungsten, other metal, titanium nitride, metal silicide, polysilicon and/or other suitable conductive material.

Figure 5:
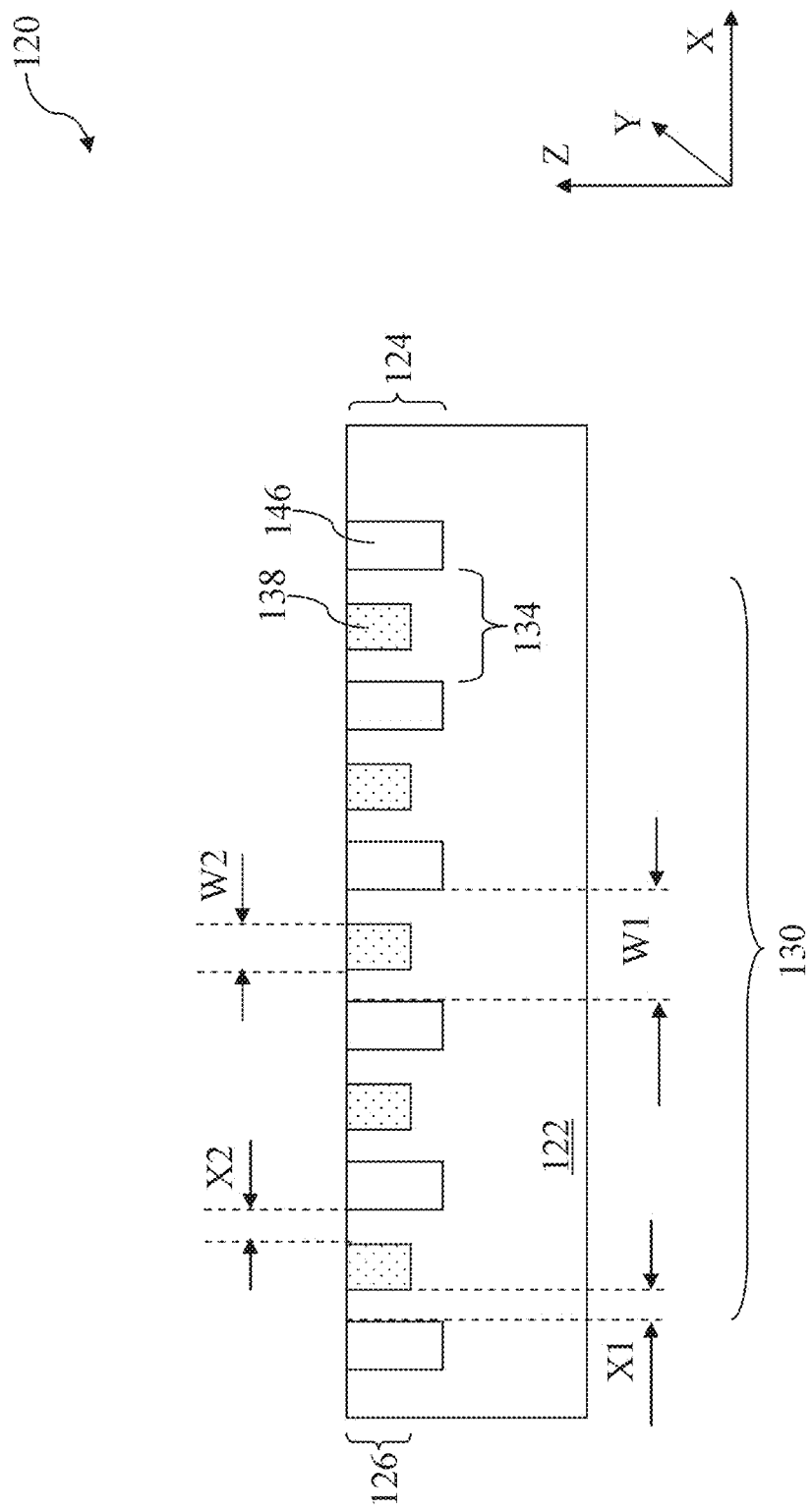

FIG. 5 is a fragmental sectional view of the electron-based mark structure 120 constructed according to various aspects in another embodiment. With reference to FIGS. 2 and 5, the overlay mark structure 120 is described below according to this embodiment.

The electron-based mark structure 120 is formed on the substrate 122. The substrate 122 includes silicon or other semiconductor material. In one embodiment, the electron-based overlay mark structure 120 include a first overlay mark 124 and a second overlay mark 126 formed in a mark region 128 of the substrate 122.

The overlay mark structure 120 in FIG. 5 is similar to the overlay mark structure 120 in FIG. 3 or FIG. 4. However, the first overlay mark 124 and the second overlay mark 126 are both formed in the substrate 122, especially formed (or embedded) in a semiconductor material layer of the substrate 122.

Various dielectric isolation features 146, such as STI features, are formed in the substrate 122 and define various semiconductor regions as active regions. Various doped wells are formed in the active regions.

In the present embodiment, the mark features 134 in the first overlay mark 124 are active regions defined by the dielectric features 146. The mark features 138 of the second overlay mark 126 are a plurality of doped wells that are formed together with functional doped wells by a same process including ion implantation.

In one embodiment, each of the first overlay mark 124 and the second overlay mark 126 includes a plurality of mark features respectively oriented in two orthogonal directions and designed for determining the overlay errors in both directions. Particularly, the mark region 128 includes a first sub-region 130 for mark features oriented in the X direction and a second sub-region 132 for mark features oriented in the Y direction. Furthermore, the first overlay mark 124 includes a first Y-oriented mark features 134 oriented in the Y direction and a first X-oriented mark features 136 oriented in the X direction. Similarly, the second overlay mark 126 includes a second Y-oriented mark features 138 oriented in the Y direction and a second X-oriented mark features 140 oriented in the X direction.

FIG. 5 only shows the mark features (the first Y-oriented mark features 134 and the second Y-oriented mark features 138) located in the first sub-region 130. Referring to FIG. 5, the doped wells 138 as the second Y-oriented mark features are configured such that at least a portion of the first Y-oriented mark features are exposed. Especially, the first Y-oriented mark features 134 have a first width W1 and the second Y-oriented mark features 138 have a second width W2. W1 is greater than W2.

In the present embodiment, the second Y-oriented mark features 138 are disposed in the active regions 134 such that the active regions 134 include exposed portions with respective dimensions X1 and X2 as illustrated in FIG. 5. Similarly, the parameters X1 and X2 are determined by the electron-based system for overlay error in the X direction. The doped wells 138 may include a n-type dopant, such as phosphorous or arsenic, and are referred to as n-wells. The doped wells 138 may include a p-type dopant, such as boron or gallium, and are referred to as p-wells.

Figure 6C:
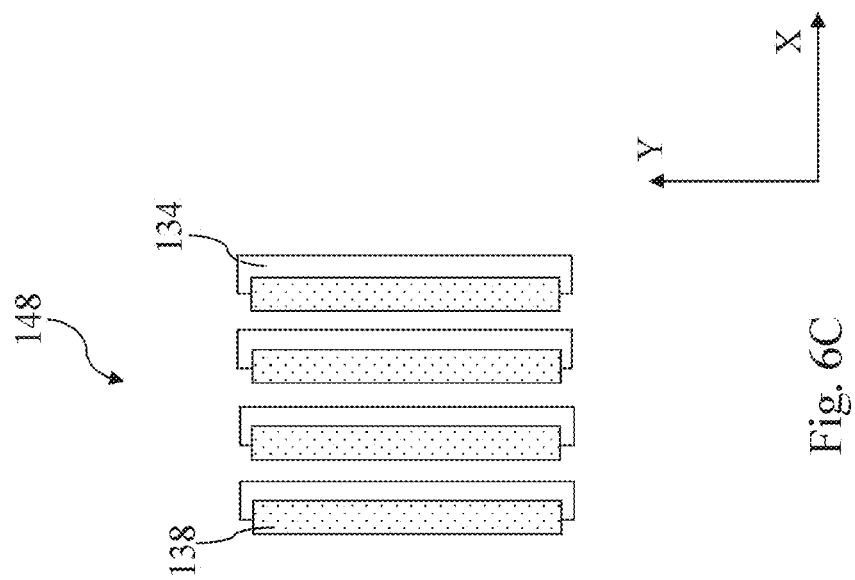
FIGS. 6A, 6B and 6C are fragmental top views of an electron-based mark structure configured according to aspects of the present disclosure in various embodiments.
Figure 6B:
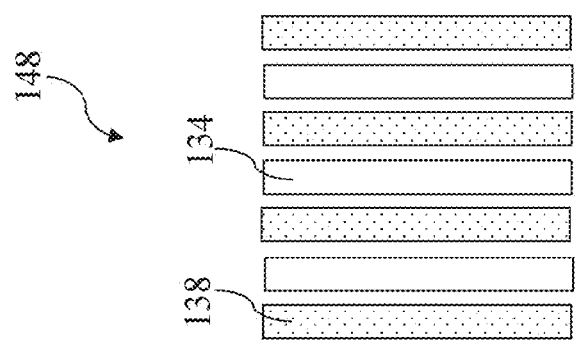
Figure 6A:
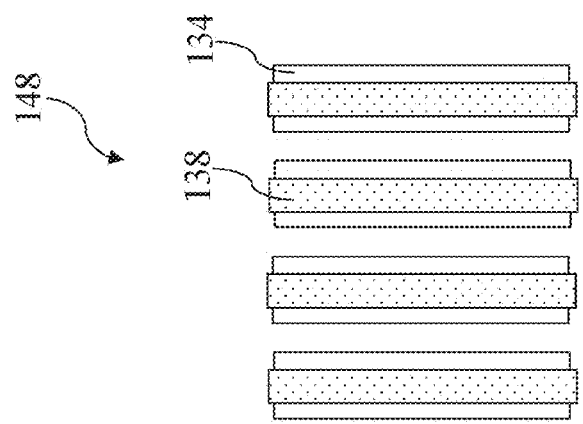

Although various embodiments of the overlay mark structure 120 are provided above. Other embodiments may be present with different material layers and/or different configurations. FIGS. 6A, 6B and 6C are fragmental top views of the overlay mark structure 148 according to various embodiments. The overlay mark structure 148 includes first Y-oriented mark features 134 and second Y-oriented mark features 138. The overlay mark structure 148 may be a portion of the overlay mark structure 120 in FIG. 2, such as the portion in the first region 130. The first Y-oriented mark features 134 are active regions and the second Y-oriented mark features 138 are gate stacks similar to those in FIG. 4. In FIG. 6A, the second Y-oriented mark features 138 are landing on the first Y-oriented mark features 134, respectively. In FIG. 6B, the second Y-oriented mark features 138 are interposed between neighboring active regions 134. In FIG. 6C, the second Y-oriented mark features 138 are partially landing on the first Y-oriented mark features 134 and partially landing on the STI features.

FIGS. 7A, 7B, 7C, 7D are fragmental top views of the overlay mark structure 150 according to various embodiments. The overlay mark structure 150 may be a portion of the overlay mark structure 120 in FIG. 2, such as the portion in the first region 130. The overlay mark structure includes first Y-oriented mark features 152 and second Y-oriented mark features 154. In this embodiment, the first Y-oriented mark features 152 are active regions and the second Y-oriented mark features 154 are doped wells formed in the active regions.

The overlay mark structure 150 is similar to the overlay mark structure 120 in FIG. 5 but configured differently. In FIG. 7A, the doped wells 154 as the second Y-oriented mark features are formed in the active regions and extended to the semiconductor material underlying the STI features.

In FIG. 7B, the overlay mark structure 150 includes three overlay marks associated with different circuit features. The overlay mark structure 150 includes first mark features 152, second mark features 154 and third mark features 156 oriented along the Y direction. The first mark features 152 are active regions, the second mark features 154 are doped wells, and the third mark features 156 are gate stacks. Three mark features are formed simultaneously with respective circuit features. For example, the third mark features 156 are formed with the functional gate stacks in the circuit regions. The overlay error between the active regions and the doped wells are determined by the overlay errors between the first mark features 152 and the second mark features 154. The overlay error between the doped wells and the gate stacks are determined by the overlay errors between the second mark features 154 and the third mark features 156. The second mark features 154 are formed in the first mark features 152 and the third mark features 156 are landing on the doped wells and the active regions and may further be extended to the STI features.

Figure 7D:
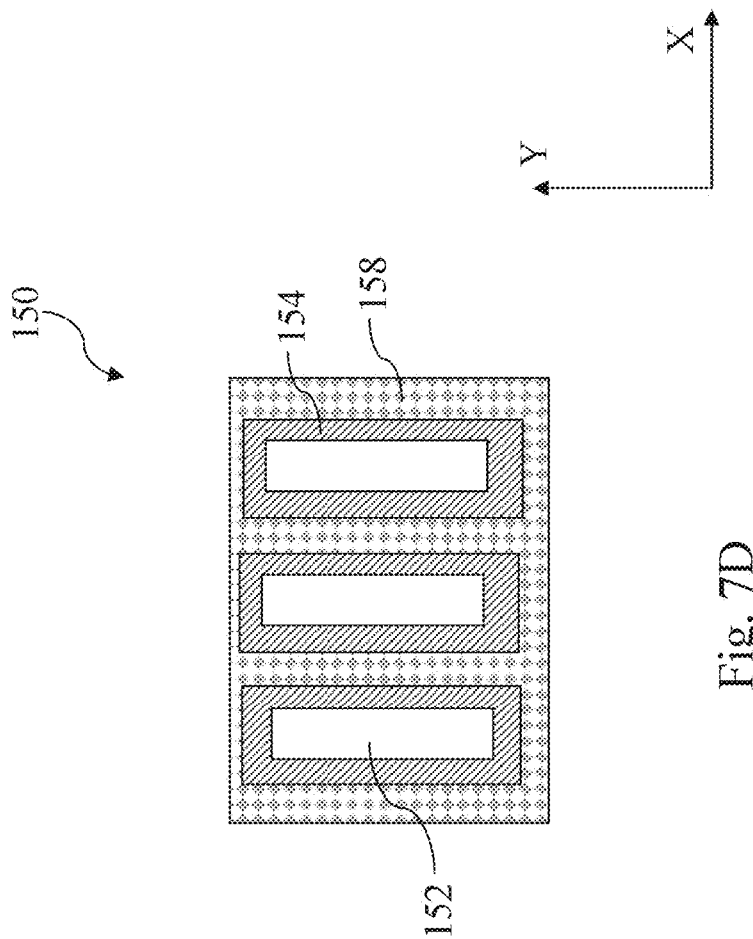
Figure 7C:
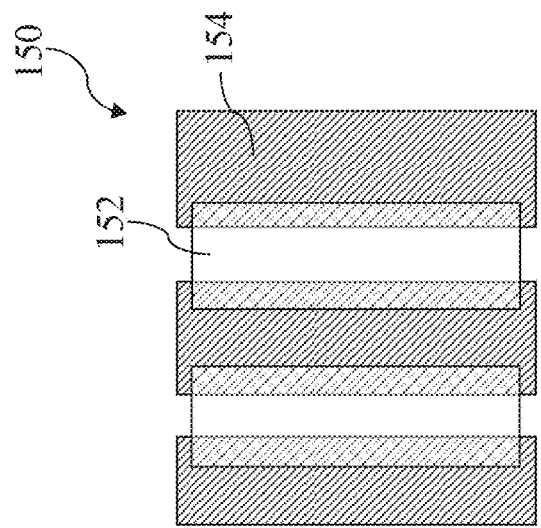

In FIG. 7C, the doped wells 154 as the second Y-oriented mark features are partially formed in the active regions 152 (the first Y-oriented mark features) and are extended to the semiconductor material underlying the STI features.

In FIG. 7D, the overlay mark structure 150 includes three overlay marks associated with different circuit features. The overlay mark structure 150 includes first mark features 152, second mark features 154 and third mark features 158 oriented along the Y direction. The first mark features 152 are active regions, the second mark features 154 are doped wells, and the third mark features 156 are silicon germanium features layer formed on the silicon substrate by epi growth for enhance the mobility and device speed. Three mark features are formed simultaneously with respective circuit features. For example, the third mark features 158 are formed with the silicon germanium features in the circuit regions. The three mark features are disposed in a configuration illustrated in FIG. 7D.

FIGS. 7E, 7F, 7G, 7H, 7I and 7J are fragmental top views of the overlay mark structure 159 according to various embodiments. The overlay mark structure 159 is designed to be capable of catching the overlay errors on both X direction and Y direction. State differently, the X-oriented mark features and Y-oriented mark features are integrated together to be substantially equal sensitive to X-direction and Y-direction for overlay errors. The overlay mark structure 159 includes a first mark feature 152 and a second mark feature 154 stacked together. The paired mark features 152 and 154 are designed to monitor the overlay errors associated with two respective material layers. In one example, the first feature 152 may be an active region and the second mark feature 154 may be a doped well formed in the active region. In another example, the first feature 152 may be an active region and the second mark feature 154 may be a STI feature formed in the substrate. In another example, the first feature 152 may be an active region and the second mark feature 154 may be a gate stack formed on the active region. In yet another example, the first feature 152 may be a gate stack and the second mark feature 154 may be a contact formed on the gate stack. In yet another example, the first feature 152 may be a metal line (or a via feature) and the second mark feature 154 may be a via feature formed on the metal line (or a metal line formed on the via feature).

In FIG. 7E, the first and second mark features 152 and 154 in the overlay mark structure 159 are designed to be round with respective diameters. So the edge spacing (such as X1) between the first mark feature and the second mark feature along the X direction provides the data for the overlay error on the X direction. Similarly, the edge spacing (such as Y1) between the first mark feature and the second mark feature along the Y direction provides the data for the overlay error on the Y direction.

In FIG. 7F, the first feature 152 in the overlay mark structure 159 is designed to have a square shape. The second mark feature 154 is designed to have a round shape. The edge spacing between the first mark feature and the second mark feature along the X direction provides the data for the overlay error on the X direction. Similarly, the edge spacing between the first mark feature and the second mark feature along the Y direction provides the data for the overlay error on the Y direction.

In FIG. 7G, the first feature 152 in the overlay mark structure 159 is designed to have a rectangular shape. The second mark feature 154 is designed to have a round shape. The edge spacing between the first mark feature and the second mark feature along the X direction provides the data for the overlay error on the X direction. Similarly, the edge spacing between the first mark feature and the second mark feature along the Y direction provides the data for the overlay error on the Y direction.

Figure 7J:
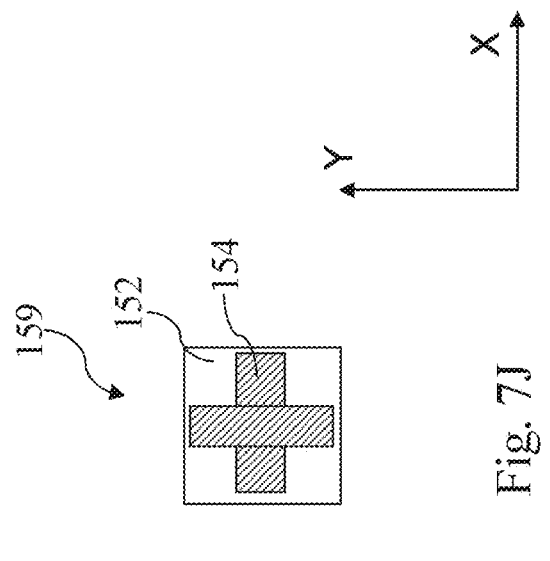
Figure 7I:
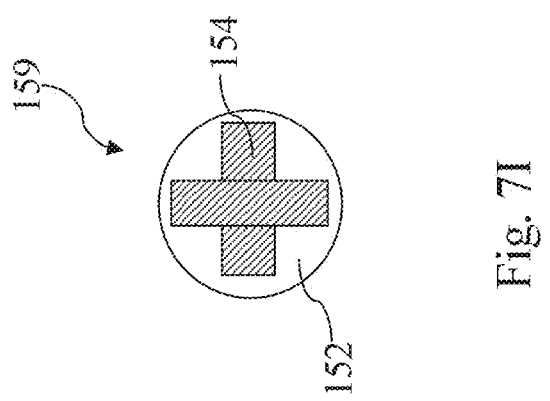
Figure 7H:
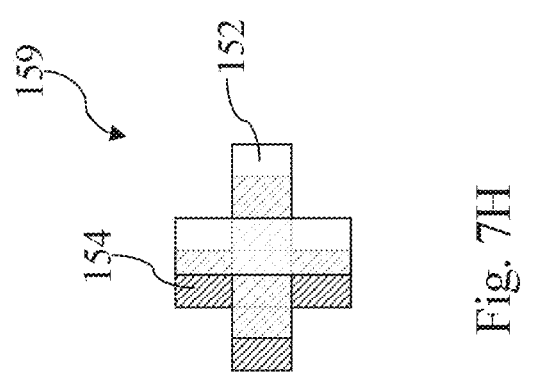

In FIG. 7H, the first feature 152 and the second feature 154 in the overlay mark structure 159 are designed to have cross shapes. The first and second mark features may have a same size and may be positioned with an offset. The edge spacing between the first mark feature and the second mark feature along the X direction provides the data for the overlay error on the X direction. Similarly, the edge spacing between the first mark feature and the second mark feature along the Y direction provides the data for the overlay error on the Y direction.

In FIG. 7I, the first feature 152 in the overlay mark structure 159 is designed to have a round shape. The second mark feature 154 is designed to have a cross shape. The edge spacing between the first mark feature and the second mark feature along the X direction provides the data for the overlay error on the X direction. Similarly, the edge spacing between the first mark feature and the second mark feature along the Y direction provides the data for the overlay error on the Y direction.

In FIG. 7J, the first feature 152 in the overlay mark structure 159 is designed to have a square shape. The second mark feature 154 is designed to have a cross shape. The edge spacing between the first mark feature and the second mark feature along the X direction provides the data for the overlay error on the X direction. Similarly, the edge spacing between the first mark feature and the second mark feature along the Y direction provides the data for the overlay error on the Y direction.

Figure 8B:
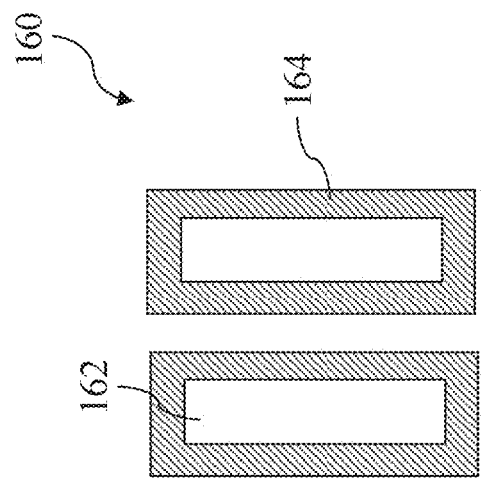
FIGS. 8A, 8B and 8C are fragmental top views of an electron-based mark structure configured according to aspects of the present disclosure in various embodiments.
Figure 8A:
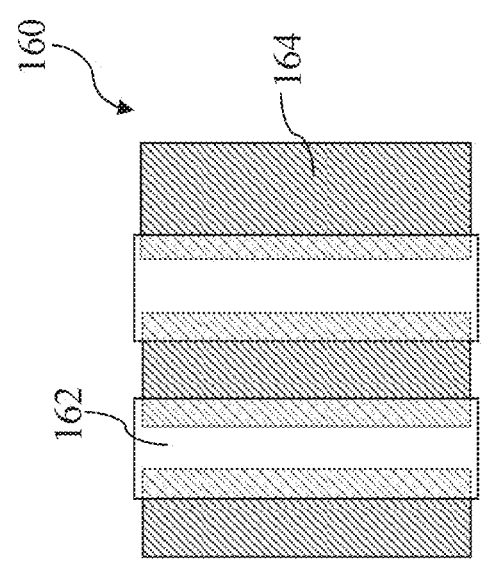
Figure 8C:
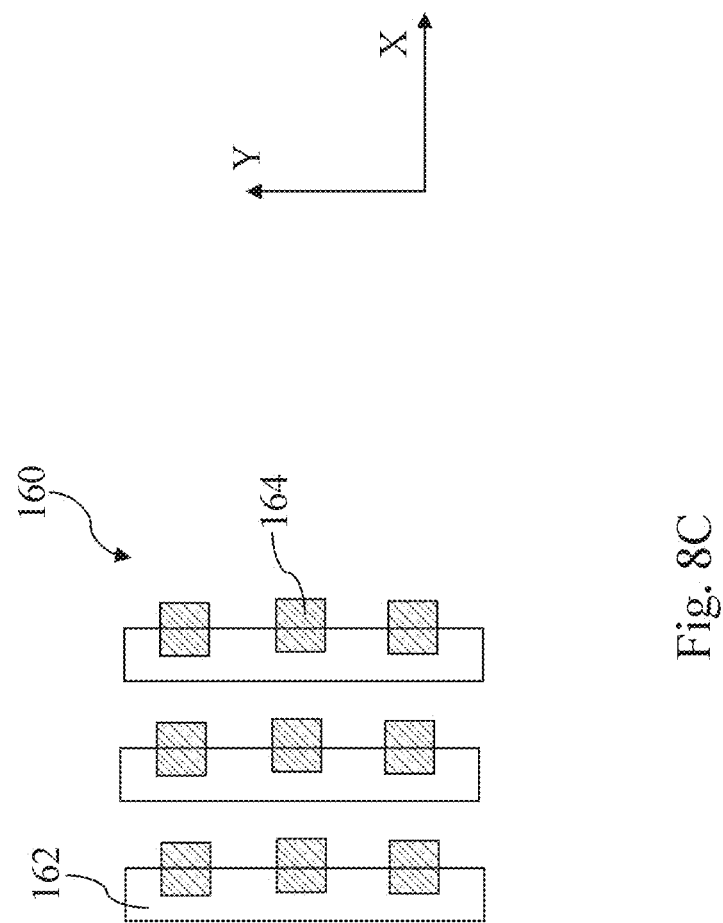

FIGS. 8A, 8B and 8C are fragmental top views of the overlay mark structure 160 according to various embodiments. The overlay mark structure 160 includes first mark features 162 and second mark features 164 oriented in the Y direction. The overlay mark structure 160 may be a portion of the overlay mark structure 120 in FIG. 2, such as the portion in the first region 130. In this embodiment, the first mark features 162 are gate stacks and the second mark features 164 are contact features.

In FIG. 8A, the contact features 164 as the second mark features are partially disposed on the gate stacks 162 as the first mark features. Particularly, each of the contact features 164 is designed to be elongated along the Y direction and lands on two neighboring gate stacks 162 spaced away in the X direction.

In FIG. 8B, the contact features 164 as the second mark features are disposed on the gate stacks 162 as the first mark features and are further extended to encompass the gate stacks 162. The contact features 164 are designed to be elongated in the Y direction.

In FIG. 8C, the contact features 164 as the second mark features are designed to partially land on respective gate stacks 162 as the first mark features. Particularly, the contact features 164 are designed to have substantially same dimensions in both X and Y directions. Each of the gate stacks 162 contacts multiple contact features 164.

FIGS. 9A and 9B are fragmental top views of the overlay mark structure 170 according to various embodiments. The overlay mark structure 170 includes first mark features 172 and second mark features 174 oriented in the Y direction. The overlay mark structure 170 may be a portion of the overlay mark structure 120 in FIG. 2, such as the portion in the first region 130. In this embodiment, the first mark features 172 are metal lines formed in a metal layer and the second mark features 174 are via features formed in a via layer and contacting the respective metal lines 172. The via features 174 are overlying the metal lines 172 or alternatively underlying the metal lines 172.

In FIG. 9A, the via features 174 as the second mark features are disposed on the metal lines 172 as the first mark features. The via features 174 are designed to be elongated in the Y direction. In FIG. 9B, the via features 174 as the second mark features are designed to partially land on respective metal lines 172 as the first mark features. Particularly, the via features 174 are designed to have substantially same dimensions in both X and Y directions. Each of the metal lines 172 contacts multiple via features 174.

FIGS. 10A, 10B, 10C and 10D are top views of a substrate having a plurality of overlay marks disposed and designed for determining overlay errors and extracting high order overlay data, such as intra-field high order parameter correction (iHOPC) that is related to imaging deformation in a global area instead of only local overlay shifting. Since the disclosed electron-based overlay mark structure is substantially smaller in size, it is achievable to incorporate a plurality of overlay marks in different locations for high order overlay analysis. The substrate includes a silicon wafer or other substrate with a semiconductor material layer formed thereon. The substrate includes a plurality of chips to be diced after the formation of the integrated circuits. Each chip includes an integrated circuit formed thereon and is packaged for use in various applications. Each of FIGS. 10A through 10D only shows one chip that includes a circuit region 180 and scribe lines 182 (schematically shown in those figures), and may additionally include frame regions between the circuit region and the scribe lines. The integrated circuit is formed in the circuit region 180. A plurality of overlay mark structures are formed and properly configured in each chip, such as overlay mark structures 184 disposed on the scribe lines 182 (and/or the frame regions) and overlay mark structure 186 disposed in the circuit region 180. Each of the overlay mark structures 184 or the overlay mark structures 186 is an electron-based overlay mark structure, such as the electron-based mark structure 120, 148, 150, 160 or 170 illustrated in respective figures. Each electron-based mark structure includes two or more overlay marks formed in a same mark region of the substrate and is configured to have one overlay mark stacked on or overlapped with another overlay mark.

Figure 10B:
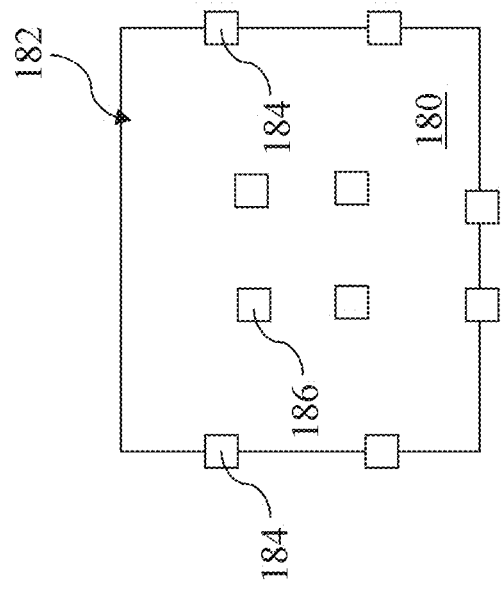
FIGS. 10A, 10B, 10C and 10D are fragmental top views of an integrated circuit substrate having a plurality of electron-based mark structures configured according to aspects of the present disclosure in various embodiments.
Figure 10A:
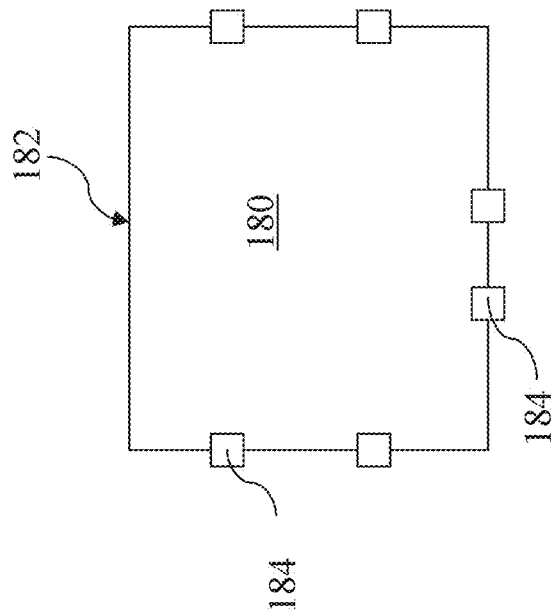
Figure 10D:
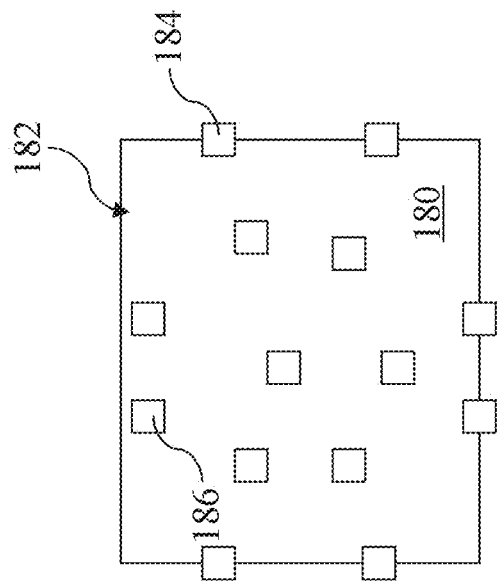
Figure 10C:
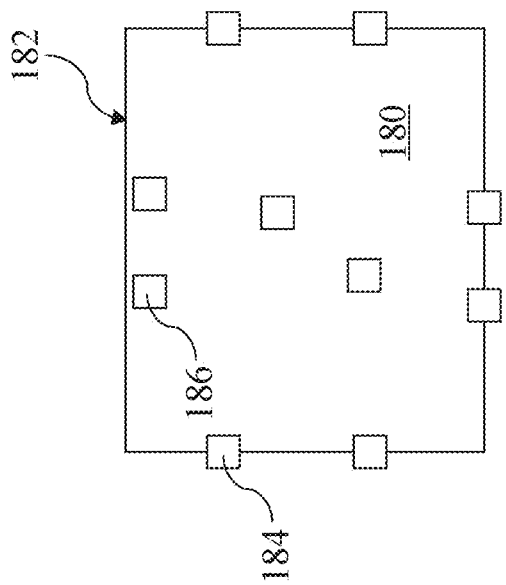

In FIG. 10A, the overlay structures 184 are disposed on the scribe lines 182. In FIG. 10B, the overlay structures 184 are disposed on the scribe lines 182, and furthermore, the overlay structures 186 are disposed in a central portion of the circuit region 180 as an array. In FIG. 10C, the overlay structures 184 are disposed on the scribe lines and furthermore, the overlay structures 186 are disposed in the central portion and edge portion of the circuit region 180. In FIG. 10D, the overlay structures 184 are disposed on the scribe lines and furthermore, the overlay structures 186 are randomly disposed in the central portion and edge portion of the circuit region 180.

Figure 11:
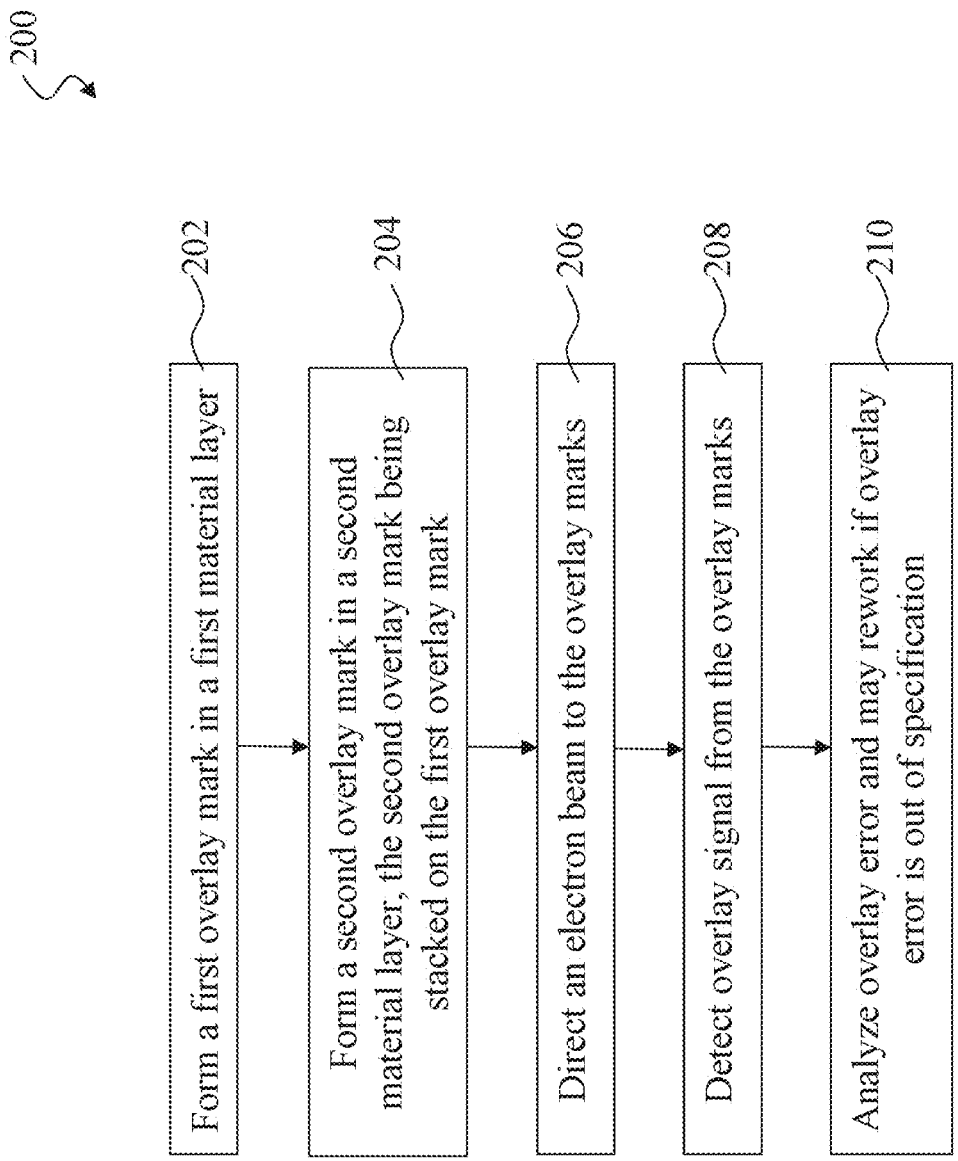
FIG. 11 is a flowchart of a method to make and utilize electron-based marks constructed according to various aspects of the present disclosure.

FIG. 11 is a flowchart of a method 200 of fabricating an integrated circuit by utilizing the electron-based overlay structure according to one embodiment. The method 200 is described with reference to FIGS. 11 and 2 through 5. The method 200 includes a step 202 by forming a first overlay mark in a first material layer, such as a metal layer on a substrate. The forming of the first overlay mark is implemented in a same process to form respective circuit features, such as metal lines. The method 200 proceeds to step 204 by forming a second overlay mark in a second material layer, such as a via layer. The second overlay mark is stacked on or overlapped with the first overlay mark. The forming of the second overlay mark is implemented in a same process to form respective circuit features, such as via features. Step 202 or step 204 includes lithography patterning (exposure and developing) and etching (alternatively ion implantation).

The method 200 proceeds to step 206 by directing an electron beam to the overlay marks for overlay determination using an electron-based system, such as the electron-based system 100. At this step, directing the electron beam further includes scanning the electron beam over the overlay structure. The method 200 also includes step 208 to detect overlay signal from the overlay marks by the electron-based system. The detecting the overlay signal may include continuously detecting the overlay signal when the electron beam is scanned over the overlay marks. The overlay signal may include secondary electrons from the substrate after the interaction between the directed electron beam and the substrate. The overlay signal may include other suitable signal from the substrate and caused by the interaction between the directed electron beam and the substrate.

The steps 206 and 208 are overlapped and may be executed during a substantially same period of time. The steps 206 and 208 are both performed in the electron-based system 100. The method 200 further includes transferring the substrate into the electron-based system 100 before the steps 206 and 208 and further includes transferring the substrate out from the electron-based system 100 after the steps 206 and 208. One or more CD measurements may be additionally implemented by the electron-based system 100 after the substrate is transferred into the electron-based system 100. The steps 206 and 208 may be repeated to a plurality of overlay structures by stepping and scanning.

The method 200 further includes step 210 to perform overlay analysis. The overlay analysis includes determination of the overlay error in each overlay structure and may further include perform high order overlay analysis. The substrate may be sent to rework if the overlay error is out of specification. For example, the second material layer may be removed and the method 200 goes back to step 204 by forming the second overlay mark.

The present disclosure provides various embodiments of stacked electron-based marks, method making the same, method utilizing the same and electron-based system. Other variations may also be possible within the scope of the invention.

Thus, the present disclosure provides one embodiment of an integrated circuit (IC) structure. The IC structure includes a semiconductor substrate having a first region and a second region having an area less than about 10 micron×10 micron; a first material layer over the semiconductor substrate and patterned to have a first circuit feature in the first region and a first mark in the second region; and a second material layer over the first material layer and patterned to have a second circuit feature in the first region and a second mark in the second region. The first mark includes a plurality of first mark features oriented in a first direction, and a plurality of second mark features oriented in a second direction perpendicular to the first direction; and the second mark includes a plurality of third mark features oriented in the first direction, and a plurality of fourth mark features oriented in the second direction.

The present disclosure also provides another embodiment of an integrated circuit (IC) structure. The IC structure includes a semiconductor substrate; a plurality of material layers formed on the semiconductor substrate, each of the material layers including a circuit pattern therein; and a plurality of overlay marks formed in the plurality of material layers, including a first overlay mark in a first material layer and a second overlay mark in a second material layer. The first overlay mark and the second overlay mark are stacked in an overlay mark region.

The present disclosure also provides an embodiment of a method. The method includes patterning a substrate to form a first circuit feature in a first region and a first overlay feature in a second region; patterning a material layer on the substrate to form a second circuit feature in the first region and a second overlay feature in the second region; directing an electron beam to the second region of the substrate; and detecting a first overlay signal from the first overlay feature and a second overlay signal from the second overlay feature for overlay analysis.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method comprising:
   forming a first overlay mark in a first region of a substrate, wherein the first overlay mark has a top surface facing away from the substrate;
   forming a second overlay mark in the first region of the substrate, wherein the second overlay mark overlaps a first portion of the top surface of the first overlay mark such that a second portion of the top surface of the first overlay mark is exposed; and
   determining an overlay shift defined as (D1−D2)/2,
   wherein the first overlay mark has a first width measured between a first edge and a second edge of the first overlay mark,
   wherein the second overlay mark has a second width measured between a third edge and a fourth edge of the second overlay mark, and
   wherein D1 is a first distance defined between the first edge and the third edge, and wherein D2 is a second distance defined between the second edge and the fourth edge.

2. The method of claim 1, further comprising detecting a first overlay signal from the first overlay mark and a second overlay signal from the second overlay mark.

3. The method of claim 1, wherein forming the first overlay mark in the first region of the substrate includes forming a first circuit feature in a second region of the substrate; and
   wherein forming the second overlay mark in the second region of the substrate includes forming a second circuit feature in the second region of the substrate.

4. The method of claim 1, wherein the first and second overlay marks are formed of the same material.

5. The method of claim 1, further comprising forming a third overlay mark over the second overlay mark.

6. A method comprising:
   forming a first overlay mark of a first material in a region of a substrate, wherein the first overlay mark has a first width measured between a first edge and a second edge of the first overlay mark;
   forming a second overlay mark of a second material in the region of the substrate, wherein the second overlay mark has a second width measured between a third edge and a fourth edge of the second overlay mark; and
   determining an overlay shift defined as (D1−D2)/2, wherein D1 is a first distance defined between the first edge and the third edge, and wherein D2 is a second distance defined between the second edge and the fourth edge.

7. The method of claim 6, wherein the first overlay mark is an active region in the substrate, and
   wherein the second overlay mark is one of a gate stack and a doped region.

8. The method of claim 6, further comprising forming a first shallow trench isolation feature and a second shallow trench isolation feature in the substrate, wherein the first overlay mark extends from the first shallow trench isolation feature to the second shallow trench isolation feature.

9. The method of claim 6, wherein forming the second overlay mark of the second material in the region of the substrate includes performing an implantation process to form the second over layer mark.

10. The method of claim 6, wherein forming the second overlay mark of the second material in the region of the substrate includes forming the second overlay mark over the first overlay mark such that a portion of the first overlay mark is exposed after the second overlay mark has been formed.

11. The method of claim 10, wherein the portion of the first overlay mark includes a top surface of the first overly mark.

12. The method of claim 6, wherein the first and second overlay marks are embedded in the substrate.

13. The method of claim 6, wherein one of the first and second materials includes a metal material.

14. A method, comprising:
    patterning a substrate to form a first circuit feature in a first region and a first overlay feature in a second region;
    patterning a material layer on the substrate to form a second circuit feature in the first region and a second overlay feature in the second region;
    directing an electron beam to the second region of the substrate; and
    detecting a first overlay signal from the first overlay feature and a second overlay signal from the second overlay feature for overlay analysis.

15. The method of claim 14, wherein the detecting a first overlay signal from the first overlay feature and a second overlay signal from the second overlay feature includes the first and second electron signals of secondary electrons.

16. The method of claim 14, wherein
    the first and second overlay features are oriented in a first direction; and
    the directing an electron beam to the first region of the substrate includes scanning the electron beam in a second direction perpendicular to the first direction.

17. The method of claim 14, wherein
    patterning a substrate to form a first circuit feature in a first region and a first overlay feature in a second region includes forming shallow trench isolation features to define a first active region as the first circuit feature and a second active region as the first overlay feature;
    the material layer is the substrate of a semiconductor material; and
    the patterning a material layer to form a second circuit feature in the first region and a second overlay feature in the second region includes performing an ion implantation to the substrate to form a first doped region as the second circuit feature and a second doped region as the second overlay feature.

18. The method of claim 14, wherein the patterning a substrate to form a first circuit feature in a first region and a first overlay feature in a second region includes:

forming an underlying material layer on the substrate; and
selectively etching the underlying material to form the first circuit feature and the first overlay feature.

19. The method of claim 14, wherein the first overlay feature includes a surface and the second overlay feature overlaps a first portion of the surface while a second portion of the surfaces remains exposed.

20. The method of claim 1, wherein the first overlay mark is an active region in the substrate, and
wherein the second overlay mark is a gate stack.

* * * * *